US011693431B2

(12) United States Patent
Wen et al.

(10) Patent No.: US 11,693,431 B2
(45) Date of Patent: Jul. 4, 2023

(54) METHOD AND SYSTEM OF MEASURING RADIO WAVE DISTRIBUTION OF A RADIO SIGNAL SOURCE AND ESTIMATING CORRESPONDING RADIO CHARACTERISTICS BY USING A FLYING VEHICLE

(71) Applicant: INDUSTRIAL TECHNOLOGY RESEARCH INSTITUTE, Hsinchu (TW)

(72) Inventors: Yi-Lun Wen, Taoyuan (TW); Yuan-Chu Tai, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 547 days.

(21) Appl. No.: 16/579,132

(22) Filed: Sep. 23, 2019

(65) Prior Publication Data
US 2020/0183426 A1    Jun. 11, 2020

(30) Foreign Application Priority Data

Dec. 10, 2018   (TW) .................................. 107144356

(51) Int. Cl.
*G05D 1/10* (2006.01)
*B64C 39/02* (2023.01)
(Continued)

(52) U.S. Cl.
CPC ........... *G05D 1/101* (2013.01); *B64C 39/024* (2013.01); *G01R 29/10* (2013.01); *B64U 2101/00* (2023.01); *H04B 7/0617* (2013.01)

(58) Field of Classification Search
CPC .. G05D 1/101; B64C 39/024; B64C 2201/12; G01R 29/10; H04B 7/0617
See application file for complete search history.

(56) References Cited

U.S. PATENT DOCUMENTS 6,021,316 A    2/2000  Heiska et al.
7,974,627 B2   7/2011  Mia et al.
(Continued)

FOREIGN PATENT DOCUMENTS

CN    102571224 A    7/2012
CN    104320208 A    1/2015
(Continued)

OTHER PUBLICATIONS

"LTE RF Planning" LTE RF Planning—Iteencyclopedia, total 2 pages.
(Continued)

*Primary Examiner* — Peter D Nolan
*Assistant Examiner* — Roy Rhee
(74) *Attorney, Agent, or Firm* — Birch, Stewart, Kolasch & Birch, LLP

(57) ABSTRACT

A method and system of measuring a radio wave distribution of a radio signal source and estimating corresponding radio characteristics by using a flying vehicle is provided. The method includes the following steps. At a number of flight positions during a measurement process, a number of first radio signals transmitted by the radio signal source are measured by the flying vehicle. A position of the radio signal source is estimated according to the first radio signals and a radio channel model. A number of first radio characteristics of the first radio signal are obtained, and a radio wave distribution of the radio signal source is estimated according to the first radio characteristics of the first radio signals and a number of second radio characteristics of a number of second radio signals in the radio wave distribution are estimated according to the first radio characteristics of the first radio signals.

18 Claims, 10 Drawing Sheets

(51) Int. Cl.
*G01R 29/10* (2006.01)
*H04B 7/06* (2006.01)
*B64U 101/00* (2023.01)

(56) References Cited

U.S. PATENT DOCUMENTS

| | | | |
|---|---|---|---|
| 8,195,171 | B2 | 6/2012 | Bernini et al. |
| 8,938,255 | B2 | 1/2015 | Tsruya et al. |
| 9,261,578 | B2 | 2/2016 | Im et al. |
| 9,797,978 | B1 | 10/2017 | Melamed et al. |
| 10,107,891 | B1* | 10/2018 | Ngo .................. G01S 5/0268 |
| 2012/0235864 | A1 | 9/2012 | Lu |
| 2013/0045745 | A1 | 2/2013 | Lin et al. |
| 2015/0333779 | A1 | 11/2015 | Itkin et al. |
| 2016/0072597 | A1 | 3/2016 | Carbajal |
| 2016/0088498 | A1 | 3/2016 | Sharawi et al. |
| 2016/0353302 | A1 | 12/2016 | Gunnarsson et al. |
| 2017/0094527 | A1 | 3/2017 | Shattil et al. |
| 2017/0350959 | A1 | 12/2017 | Yaqub et al. |
| 2018/0011180 | A1* | 1/2018 | Warnick .................. H01Q 3/34 |
| 2020/0379080 | A1* | 12/2020 | Sakai .................. G01S 5/145 |

FOREIGN PATENT DOCUMENTS

| | | |
|---|---|---|
| CN | 102210168 B | 5/2015 |
| CN | 103344979 B | 8/2015 |
| CN | 105917547 A | 8/2016 |
| CN | 107632613 A | 1/2018 |
| CN | 206976554 U | 2/2018 |
| CN | 108896957 A | 11/2018 |
| EP | 2 485 402 A2 | 8/2012 |
| TW | I463162 B | 12/2014 |
| TW | I495282 B | 8/2015 |
| TW | I544822 B | 8/2016 |
| WO | WO 2015/122822 A1 | 8/2015 |
| WO | WO 2017/207714 A1 | 12/2017 |

OTHER PUBLICATIONS

Amorim et al. "Radio Channel Modeling for UAV Communication Over Cellular Networks", IEEE Wireless Communications Letters, vol. 6, No. 4, Aug. 2017, p. 514-517.

Chandhar et al. "Massive MIMO as Enabler for Communications with Drone Swarms", 2016 international Conference on Unmanned Aircraft Systems (ICUAS) Jun. 7-10, 2016, Arlington, VA USA, p. 347-354.

Chen et al. "Optimum Placement of UAV as Relays", IEEE Communications Letters, vol. 22, No. 2, Feb. 2018, p. 248-251.

Ericsson "Cell Planning Principles" Stutdent Text EN/LZT 123 3314 R3A, 3 Radio Wave Propagation, total 14 pages.

Hamza et al. "A Quadcopter Controller to Maintain Radio Link Quality", May 2015, total 7 pages.

Li et al. "Outdoor Location Estimation in Changeable Environments", IEEE Communications Letters, vol. 17, No. 11, Nov. 2013, p. 2072-2075.

Li et al. "Outdoor Location Estimation Using Received Signal Strength Feedback", IEEE Communications Letters, vol. 16, No. 7, Jul. 2012, p. 978-981.

Milanović et al. "Radio Wave Propagation Mechanisms and Empirical Models for Fixed Wireless Access Systems", Technical Gazette 17, 1(2010), p. 43-52.

Ono et al. "A Wireless Relay Network Based on Unmanned Aircraft System With Rate Optimization", IEEE Transactions on Wireless Communications, vol. 15, No. 11, Nov. 2016, p. 7699-7708.

Rupasinghe et al. "Non-Orthogonal Multiple Access for mmWave Drones with Multi-Antenna Transmission", IEEE, Asilomar 2017, p. 958-963.

Vidal et al. "UAV Vision Aided Positioning System for Location and Landing", IEEE 2017, p. 228-233.

Wikipedia "Radio Propagation model" total 2 pages.

Yin et al. "Learning Adaptive Temporal Radio Maps for Signal-Strength-Based Location Estimation", p. 1-14.

Zhao et al. "Research on 30-Beamforming Based on Adaptive Algorithm", Journal of Beijing University of Posts and Telecommunications, vol. 37, No. 4, Aug. 2014, total 6 pages.

Zhi-Yu Zheng "60-GHz High-gain and Wideband Antenna Arrays with Electromagnetic Band-Gap Reflector for Handset Applications and Antenna Arrays Based on Composite Right/Left-Handed Transmission Line" Department of Electrical Engineering National Sun Yat-sen University Master Thesis, Jul. 2014, total 78 pages.

* cited by examiner

METHOD AND SYSTEM OF MEASURING RADIO WAVE DISTRIBUTION OF A RADIO SIGNAL SOURCE AND ESTIMATING CORRESPONDING RADIO CHARACTERISTICS BY USING A FLYING VEHICLE

This application claims the benefit of Taiwan application Serial No. 107144356, filed Dec. 10, 2018, the disclosure of which is incorporated by reference herein in its entirety.

TECHNICAL FIELD

The disclosure relates in general to a method and system of measuring radio wave distribution of a radio signal source and estimating corresponding radio characteristics by using a flying vehicle.

BACKGROUND

In recent years, the application of performing low altitude measurement or aerial photography by using a flying vehicle has attracted more and more people's attention. The flying vehicle, for example, a drone, can take the images of the land at a low altitude by way of remote-control, and can further transmit the captured images to a receiving station on the ground. Or, the flying vehicle can fly to a high-rise building, for example, a sky scraper or a bridge, to examine the structure or characteristics of the high-rise building. It is very convenient to send a flying vehicle to the air to observe and examine the land or buildings and transmit the captured images or obtained information to the ground through wireless communication.

However, wireless communication may be disconnected unexpectedly when a flying vehicle performs signal measuring and recording at a low altitude. Moreover, under the restriction of the regulatory power limit, the flying vehicle normally can only have a short communication distance. Therefore, it has become a prominent task for the industries to avoid unexpected communication failure and to extend the communication distance.

SUMMARY

According to one aspect of the disclosure, a method of measuring a radio wave distribution of a radio signal source and estimating corresponding radio characteristics by using a flying vehicle is provided. The method includes the following steps. At a number of flight positions during a measurement process, a number of first radio signals transmitted by the radio signal source are measured by the flying vehicle. A position of the radio signal source is estimated according to the first radio signals and a radio channel model. A number of first radio characteristics of the first radio signals are obtained, and a radio wave distribution of the radio signal source are estimated according to the first radio characteristics of the first radio signals and a number of second radio characteristics of a plurality of second radio signals in the radio wave distribution are estimated according to the first radio characteristics of the first radio signals.

According to another aspect of the disclosure, a system of measuring a radio wave distribution of a radio signal source and estimating corresponding radio characteristics by using a flying vehicle is provided. The system includes a flying vehicle, a flight attitude control module, and a radio characteristic management module. The flying vehicle has a radio module configured to receive a number of first radio signals transmitted by a radio signal source at a number of flight positions during a measurement process. The flight attitude control module is configured to control a flight path of the flying vehicle. The flight path includes the flight positions. The radio characteristic management module is configured to estimate a position of the radio signal source according to the first radio signals and a radio channel model, obtain a number of first radio characteristics of the first radio signals and estimate the radio wave distribution of the radio signal source according to the first radio characteristics of the first radio signals and estimating a number of second radio characteristics of a number of second radio signals in the radio wave distribution according to the first radio characteristics of the first radio signals.

The above and other aspects of the invention will become better understood with regard to the following detailed description of the preferred but non-limiting embodiment(s). The following description is made with reference to the accompanying drawings.

Figure 1A:
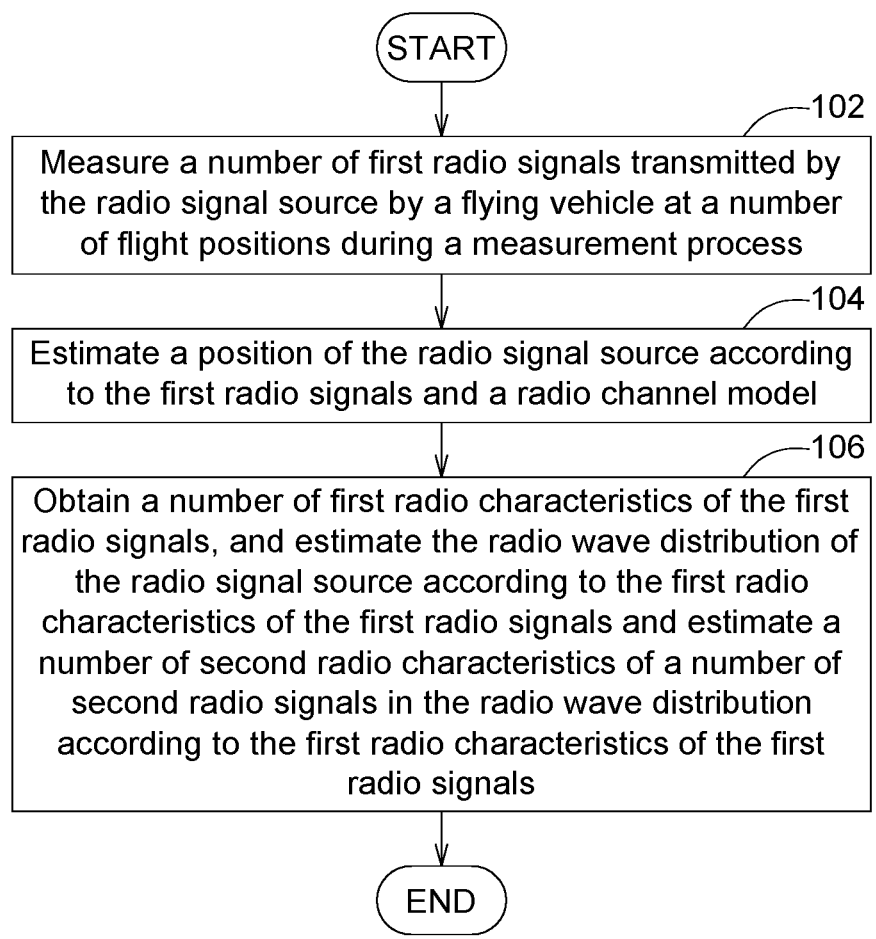
FIG. 1A is a flowchart of a method of measuring radio wave distribution of a radio signal source and estimating corresponding radio characteristics by using a flying vehicle according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The present disclosure provides a method and system of measuring a radio wave distribution of a radio signal source and estimating corresponding radio characteristics by using a flying vehicle. The flying vehicle can be, for example, a drone. During a measurement process, the flying vehicle measures a number of first radio signals of a radio signal source (for example, a base station) by using a radio module, and the method and system of the present disclosure obtains the quality of radio signals in each area of the space (including the area not actually traveled by the flying vehicle) and further obtains the radio wave distribution in each area of the space. Thus, a most favorable flight path can be designed for the flying vehicle to perform an observation task during a flight process, and unexpected disconnection of wireless network communication can be avoided. Besides, the antenna radiation pattern or orientation of the drone can be adjusted to be toward the radio signal source obtained by using the method and system of the present disclosure, such that the communication distance of wireless communication can be extended.

Figure 2:
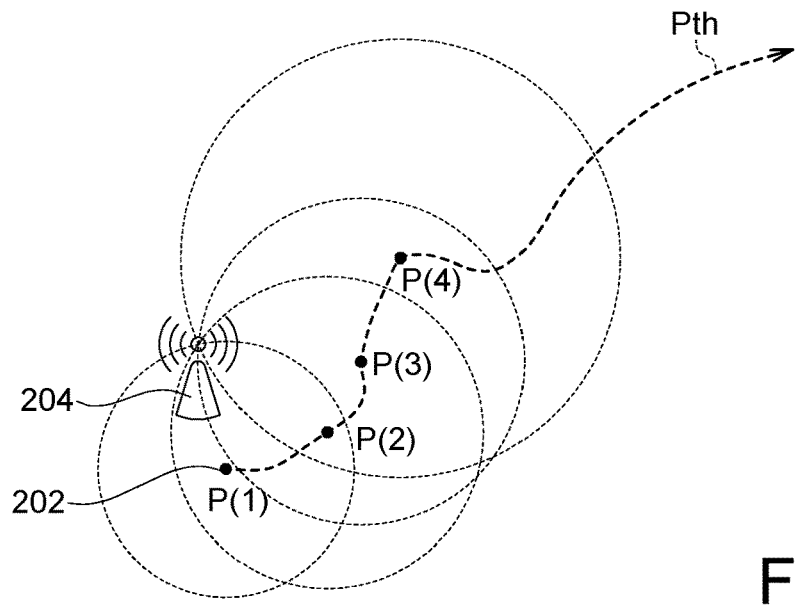
FIG. 2 is a schematic diagram of relative position between the flying vehicle and the radio signal source in the method of FIG. 1A.

Referring to FIG. 1A, a flowchart of a method of measuring a radio wave distribution of a radio signal source and estimating corresponding radio characteristics by using a flying vehicle according to an embodiment of the present disclosure is shown. Referring to FIG. 2, a schematic diagram of relative position between the flying vehicle and the radio signal source in the method of FIG. 1A is shown. The method includes the following steps. In step 102, at a number of flight positions during a measurement process, a number of radio signals transmitted by a radio signal source 204 are measured by a flying vehicle 202. Then, in step 104, the position of the radio signal source 204 is estimated according to the first radio signals and a radio channel model. Then, in step 106, a number of first radio characteristics of the first radio signals are obtained, and a radio wave distribution of the radio signal source are estimated according to the first radio characteristics of the first radio signals and second radio characteristics of a number of second radio signals in the radio wave distribution are estimated according to the first radio characteristics of the first radio signals.

The radio wave distribution of the radio signal source means the entire coverage scope of the radio signal source. The first radio characteristics or the second radio characteristics include one or more than one of the following items: reference signal received power (RSRP), received signal code power (RSCP), received signal level (RX LEVEL), received signal strength indication (RSSI), signal-to-noise ratio (SNR), data transmission rate, signal delay, band stability, or probability of staying connected. The second radio characteristics of the second radio signals in the radio wave distribution mean the second radio characteristics of the second radio signals in every points of the entire coverage scope of the radio signal source, even the points where the flying vehicle never flies and receives the first radio signals. Assume the volume of the entire coverage scope of the radio signal source is defined as 100 units. The flight positions of the flying vehicle 202 during a measurement process for measuring the first radio signals transmitted by the radio signal source 204 may be 3 to 5 units or more units.

In the embodiment of the disclosure, through measuring the first radio signals transmitted by the radio signal source 204 in part of the areas (i.e. 3 to 5 units or more units) of the entire coverage scope, the entire coverage scope can be estimated (that is, the radio wave distribution of the radio signal source can be estimated based on the result of the measurement of the first radio characteristic of the first radio signals). Furthermore, through measuring the first radio signals transmitted by the radio signal source 204 in part of the areas (i.e. 3 to 5 units or more units) of the entire coverage scope, almost all second radio characteristics of the second radio signals which would be potentially received in the entire coverage scope can be obtained. That is, the second radio characteristic of the second radio signals in the radio wave distribution of the radio signal source can be estimated based on the result of the measurement for the first radio characteristics of the first radio signals.

Figure 1B:
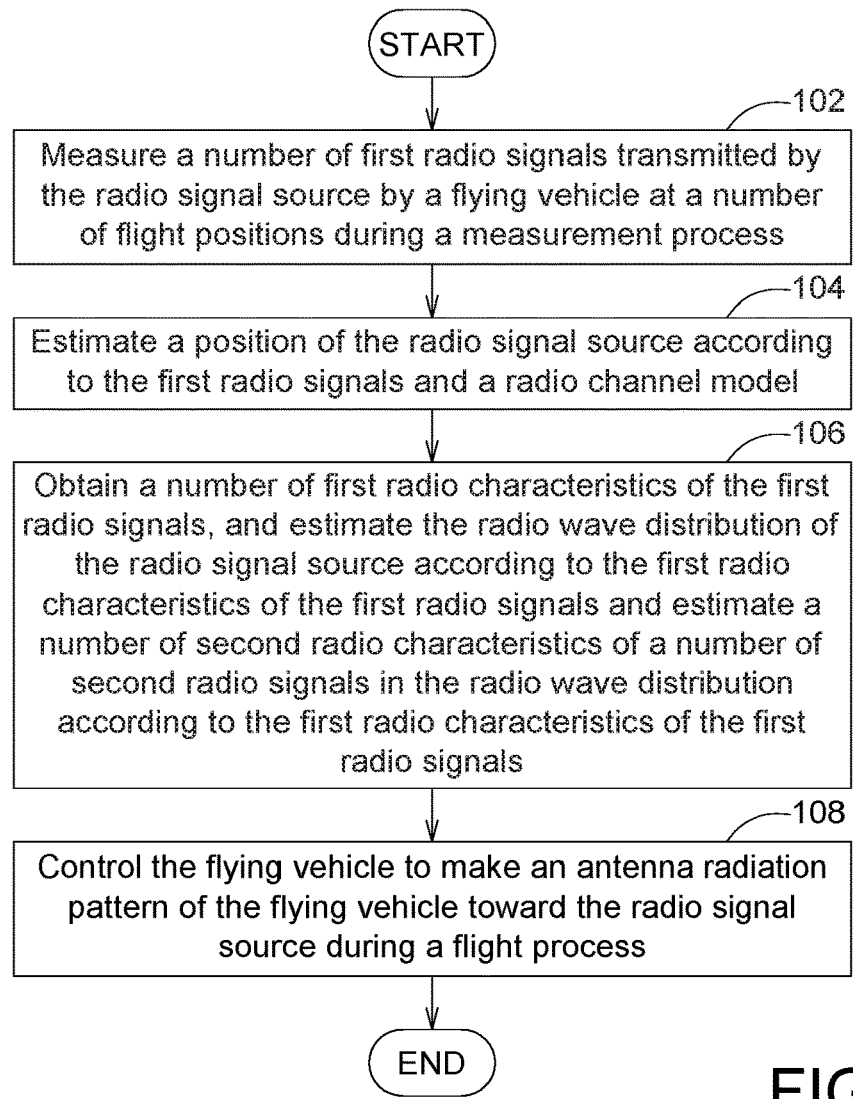
FIG. 1B is a flowchart of a method of measuring radio wave distribution of a radio signal source and estimating corresponding radio characteristics by using a flying vehicle according to another embodiment of the present disclosure.

Referring to FIG. 1B, a flowchart of a method of measuring a radio wave distribution of a radio signal source and estimating corresponding radio characteristics by using a flying vehicle according to another embodiment of the present disclosure is shown. The embodiment of FIG. 1B is different from the embodiment of FIG. 1A in that the method may further include step 108. In step 108, the flying vehicle is controlled to make an antenna radiation pattern of the flying vehicle toward the radio signal source during a flight process, such that the quality of radio connection between the flying vehicle and the radio signal source can be improved or the remote-control distance of the flying vehicle can be extended.

Through the above method, the radio wave distribution of the radio signal source (for example, the base station) in the space can be measured by the flying vehicle (for example, drone), and the radio wave distribution in the space and the second radio characteristics of the second radio signals in the radio wave distribution in the space, for example, the radio wave distribution of 4G long term evolution (LTE) signal at a high altitude or different altitudes in the 3D space and the corresponding second radio characteristics of the second radio signals, can be estimated. Moreover, when the flying vehicle formally flies to perform a task, the antenna radiation pattern of the flying vehicle can be adjusted to be toward the radio signal source, such that the distance of wireless communication between the flying vehicle and the radio signal source can be extended.

Figure 3:
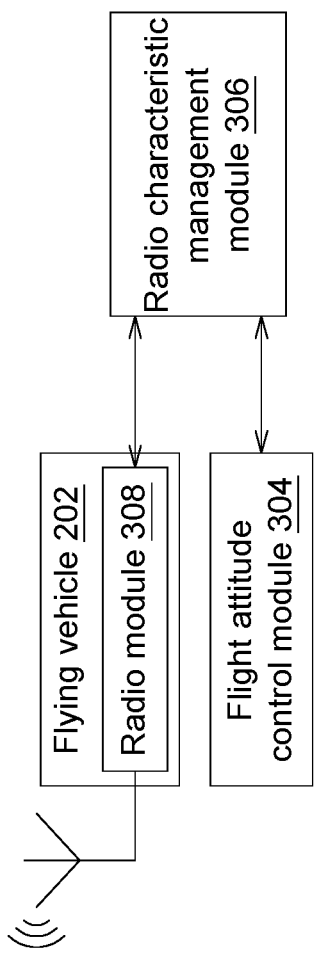
FIG. 3 is a system of measuring radio wave distribution of a radio signal source and estimating corresponding radio characteristics by using a flying vehicle.

Referring to FIG. 3, a system of measuring radio wave distribution of a radio signal source and estimating corresponding radio characteristics by using a flying vehicle is shown. The measuring and estimating system 300 includes a flying vehicle 202, a flight attitude control module 304 and a radio characteristic management module 306. The flying vehicle 202 has a radio module 308, for example, a radio transceiver, configured to receive a number of first radio signals transmitted by a radio signal source 204 at a number of flight positions during a measurement process. The flight attitude control module 304 is configured to control a flight path of the flying vehicle 202. The flight path includes a number of flight positions. The radio characteristic management module 306 is configured to estimate the position of the radio signal source 204 according to the first radio signals and the radio channel model, obtain a number of first radio characteristics of the first radio signals, and estimate the radio wave distribution of the radio signal source 204 according to the first radio characteristics of the first radio signals and estimate the second radio characteristics of a number of second radio signals in the radio wave distribution according to the first radio characteristics of the first radio signals.

The present disclosure can be used in more than one flying vehicle 202 and more than one radio module 308 of the flying vehicle 202 to receive the first radio signals in the space, and the radio characteristic management module 306 estimates and constructs a corresponding radio wave distribution in the space, that is, a distribution of the quality of the second radio signals. The radio characteristic management module 306 communicates with the radio module 308 and the flight attitude control module 304. In an embodiment, the flying vehicle 202 may include the flight attitude control module 304 and/or the radio characteristic management module 306. In an embodiment, the flight attitude control module 304 and/or the radio characteristic management module 306 can be implemented in a control station (not shown) configured to control or operate the flying vehicle 202. In an embodiment, the flight attitude control module 304 and/or the radio characteristic management module 306 can be implemented in a server or a mobile device, which can communicate with the flying vehicle 202.

Figure 4:
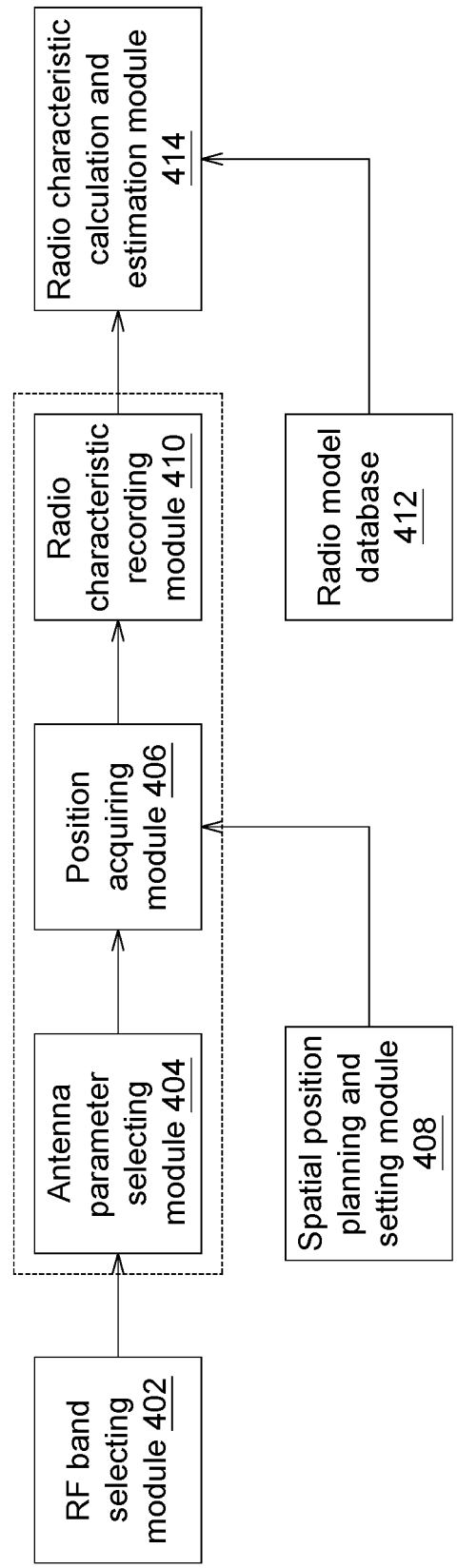
FIG. 4 is a detailed block diagram of an example of the radio characteristic management module of FIG. 3.

Referring to FIG. 4, a detailed block diagram of an example of the radio characteristic management module 306 of FIG. 3 is shown. The radio characteristic management module 306 includes, for example, an RF band selecting module 402, an antenna parameter selecting module 404, a position acquiring module 406, a spatial position planning and setting module 408, a radio characteristic recording module 410, a radio model database 412, and a radio characteristic calculation and estimation module 414.

The RF band selecting module 402 is configured to select a radio frequency at which the radio module 308 communicates with the radio signal source 204. The radio frequency has corresponding physical characteristics, for example, transmission distance. The selection of the radio frequency also affects the selection of the radio channel model.

The antenna parameter selecting module 404 is configured to select the antenna parameters, for example, gain of the antenna, radiation angle and radiation scope of the antenna, and the number of sets of antenna (one or more than one sets of antenna). The position acquiring module 406 is configured to obtain a set of 3D coordinates of the flying vehicle 202 in the space.

The spatial position planning and setting module 408 is configured to provide a flight path to the flying vehicle 202. The flying vehicle 202 flies along this path to obtain more first radio characteristics at specific areas in the space. The flight path can be: (1) a flight path which is not specifically defined, for example, a default flight path of the flying vehicle 202; (2) a complete flight path defined at a specific density in a specific space; (3) a zig-zag flight path.

The radio characteristic recording module 410 is configured to record the first radio characteristics corresponding to each spatial position. The radio model database 412 is configured to store at least one of the following information: (1) radiation pattern of various radio antennas of the radio base station having different model numbers; (2) position of the radio base station, and height and angle of the radio antenna of the radio base station; (3) various radio channel models.

The radio characteristic calculation and estimation module 414 uses the radio channel model or cooperates with the radio channel model to calculate at least one of the following information: (1) position of the radio base station; (2) the first radio characteristics are normalized and then are compared with the radiation patterns of the radio antenna; if similar radiation patterns can be successfully found, then the radio coverage and the second radio characteristics within the radio coverage are estimated according to the radiation patterns; (3) the first radio characteristics are normalized and then are compared with the radiation patterns of the radio antenna; if no similar radiation pattern can be found, then the radio radiation strengths on the path between the radio signal source (the base station) and the measuring point is estimated according to the radio channel model selected at that time. If the radiation strengths can be obtained on several paths, then the radio radiation strength at the positions between any two paths can be estimated by using the radio channel model with the calculation of, for example, interpolation, weighting or averaging.

Each module disclosed above can be implemented, for example, by a hardware circuit and/or a processor executing software or a machine executable code. Each module described above can also be implemented by other hardware reading relevant firmware. The software or machine executable code can be, for example, stored in a readable storage medium, for example, volatile memory or non-volatile memory, hard disc, solid state disk (SSD), flash memory, or read-only memory (ROM).

Figure 5A:
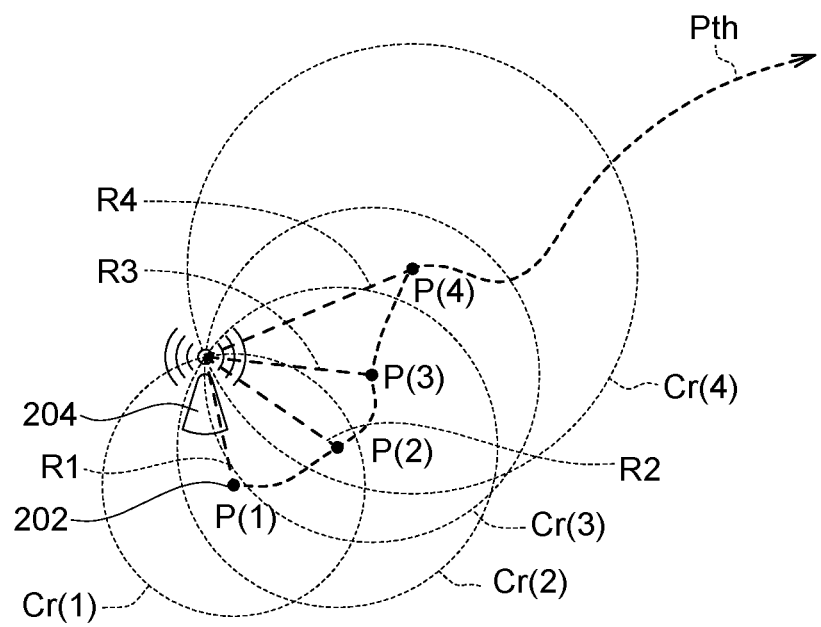
FIG. 5A is a schematic diagram of the position of the radio signal source estimated in step 104.
Figure 5B:
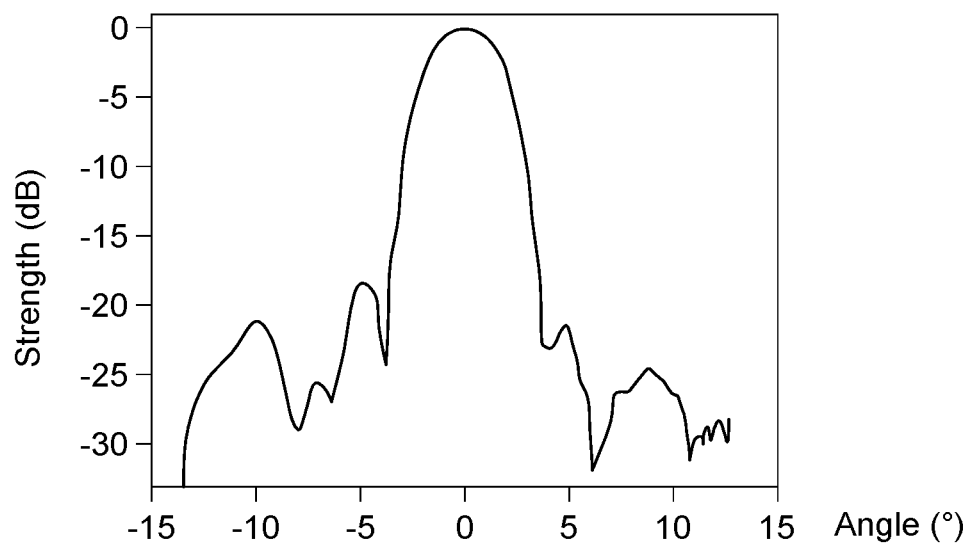
FIG. 5B is a schematic diagram of the radio signal source pattern generated after the radio characteristic of the radio signal is obtained in step 106.
Figure 5C:
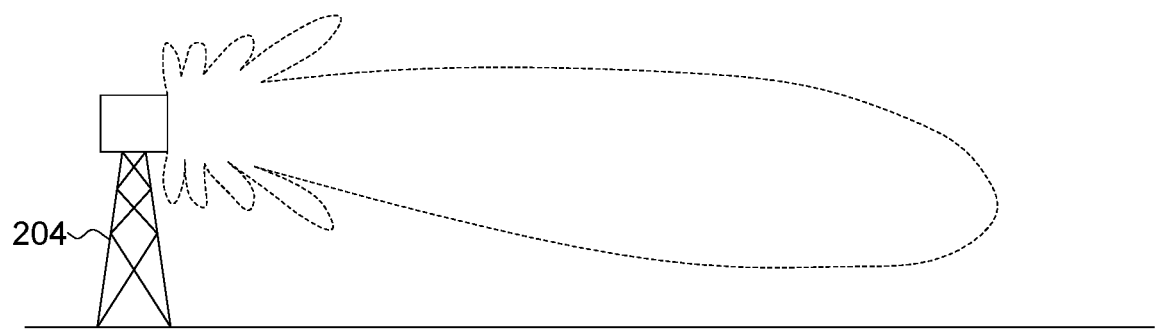
FIG. 5C is a schematic diagram of the radio wave distribution of the radio signal source estimated in step 106.
Figure 5D:
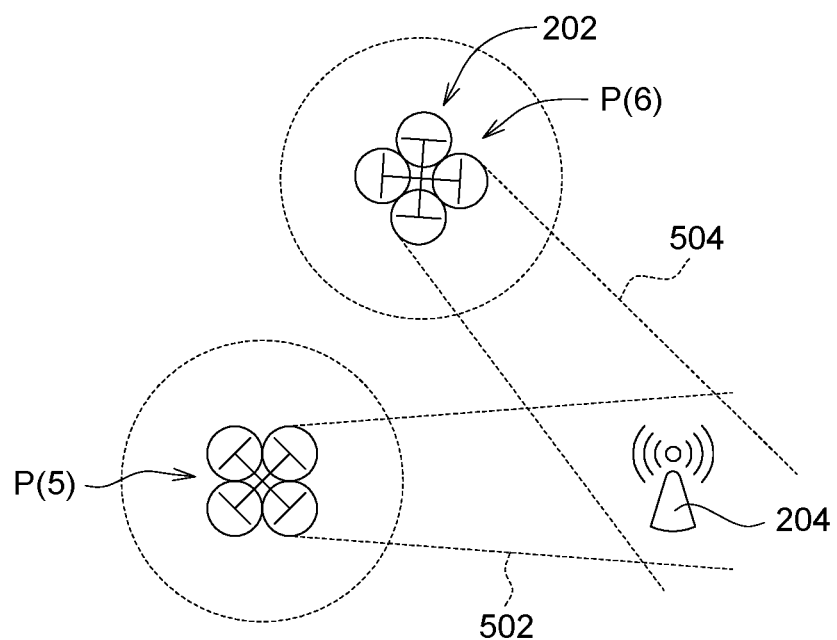
FIG. 5D is a schematic diagram of the antenna radiation pattern of the flying vehicle facing the radio signal source during the flight process.

Refer to FIGS. 5A to 5D. FIG. 5A is a schematic diagram of estimating the position of the radio signal source in step 104. FIG. 5B is a schematic diagram of the radiation pattern of the radio signal source generated after the first radio characteristics of the first radio signals are obtained in step 106. FIG. 5C is a schematic diagram of the radio wave distribution of the radio signal source estimated in step 106. FIG. 5D is a schematic diagram showing the antenna radiation pattern of the flying vehicle toward the radio signal source during the flight process.

Refer to FIG. 1B and FIG. 5A. Before the flying vehicle 202 performs formal aerial photography or measurement, the measuring and estimating system 300 performs a measurement process beforehand to establish a radio wave distribution of the radio signal source in step 106. After the radio wave distribution is obtained, the antenna radiation pattern of the flying vehicle is adjusted to be toward the radio signal source during the flight process of performing formal aerial photography or measurement, such that the quality of radio connection between the flying vehicle and the radio signal source can be improved and a larger communication distance can be obtained.

In detail, in step 102, at a number of flight positions, for example, flight positions P(1) to P(4), during a measurement process, a number of first radio signals transmitted by the radio signal source 204 are measured by the flying vehicle 202. In an embodiment, the first radio signals transmitted by the radio signal source 204 and received by the flying vehicle 202 record an identification code (ID) of the radio signal source 204. Based on the identification code, the flying vehicle 202 determines whether the received first radio signals are transmitted by the same radio signal source 204. Then, in step 104, a suitable radio channel model is selected by the radio characteristic management module 306, for example, according to the radio frequency used by the flying vehicle 202 and the characteristics of the position where the flying vehicle 202 is located. Then, a position of the radio signal source 204 is estimated by the radio characteristic management module 306 according to the first radio signals and the radio channel mode. The radio channel model provides a signal attenuation corresponding to the distance to the radio signal source 204. In an embodiment, the first radio signals carries the radio output power of the radio signal source 204, and the signal attenuation can be obtained from the power of the first radio signals received by the flying vehicle 202 with reference to the radio output power of the radio signal source 204. The distance corresponding to the attenuation can be obtained from the signal attenuation with reference to the radio channel model, and the distance between the flying vehicle 202 and the radio signal source 204 can also be obtained.

As indicated in FIG. 5A, assume the distance between the flying vehicle 202 and the radio signal source 204 is R1 when the flying vehicle 202 is at position P(1), and the distances between the flying vehicle 202 and the radio signal source 204 are R2 to R4 when the flying vehicle 202 is at positions P(2) to P(4). Thus, the coordinates of the radio signal source 204 can be obtained according to the coordinates of the positions P(1) to P(4), and the position of the radio signal source 204 can be obtained accordingly. In an embodiment, when the distance between the flying vehicle 202 and the radio signal source 204 is R1, the radio signal source 204 is located at a particular point on the circle Cr(1) whose radius is R1. When the distance between the flying vehicle 202 and the radio signal source 204 is R2, R3 or R4, the radio signal source 204 is located at a particular point on the circle Cr(2), Cr(3) or Cr(4) whose radius is R2, R3 or R4. Thus, the radio signal source 204 may be located at the intersection of the circles Cr(1) to Cr(4). Even when the circles Cr(1) to Cr(4) do not intersect at a point, possible position of the radio signal source 204 still can be estimated according to the intersecting area defined by the circles Cr(1) to Cr(4). In this situation, the position of the radio signal source 204 can be referred to the intersecting area defined by at least two of the circles Cr(1) to Cr(4).

In step 106, a number of first radio characteristics of the first radio signals, for example, signal strengths (i.e. radiation strengths of the first radio signals), are obtained by the radio characteristic management module 306 according to the first radio signals measured by the flying vehicle 202. The radio characteristic management module 306 estimates a radio wave distribution of the radio signal source 204 according to the first radio characteristics of the first radio signals. For example, the flying vehicle 202 can horizontally or vertically surround the radio signal source 204 to obtain a horizontal radiation pattern or a vertical radiation pattern of the radio signal source 204 as shown in FIG. 5B. Then, several horizontal radiation patterns and several vertical radiation patterns can be combined to obtain a radio wave distribution of the radio signal source 204 as shown in FIG. 5C. In step 106, a number of first radio characteristics of the first radio signals are obtained, and a radio wave distribution of the radio signal source is estimated according to the first radio characteristics of the first radio signals. In an embodiment, after the radio wave distribution of the radio signal source 204 or the radio wave distribution of a number of radio signal sources 204 is obtained, the position of one or more than one radio signal source 204 can be obtained, the radio wave distribution at each position in the space can be calculated, and the second radio characteristics of the second radio signals in the radio wave distribution in the space can be estimated. When the flying vehicle 202 formally flies to perform aerial photography or measurement, the formal flight path of the flying vehicle 202 is adjusted according to the position of one or more than one radio signal source 204 and the strengths of the second radio signals at each position. Thus, the strength of the radio signals transmitted by the radio signal source on the formal flight path of the flying vehicle 202 can be larger than a threshold, and unexpected disconnection of wireless communication of the flying vehicle 202 can be avoided. Besides, during a formal flight process in which the flying vehicle 202 flies to perform a task, the antenna radiation pattern of the flying vehicle 202 is adjusted to make the antenna radiation pattern of the flying vehicle 202 toward the radio signal source 204 as indicated in FIG. 5D. For example, at the flight position P(5), the antenna radiation pattern 502 of the flying vehicle 202 is toward the radio signal source 204; at the flight position P(6), the antenna radiation pattern 504 of the flying vehicle 202 is toward the radio signal source 204. Thus, in comparison to the omnidirectional antenna, under the same transmission power, the flying vehicle 202 can adopt the directional antenna radiation pattern, such that the communication distance between the flying vehicle 202 and the radio signal source 204 can be extended and the quality of radio connection between the flying vehicle and the radio signal source can be improved.

Detailed descriptions of each step of FIG. 1A are disclosed below. In step 102, the flight path of the flying vehicle 202 is adjusted, such that the flying vehicle 202 flies to a number of flight positions during a measurement process. The flight path can be a task movement path, a precise radio waveform mapping movement path, or a partial radio waveform mapping movement path of the flying vehicle 202. The flight positions can be several positions on the task movement path, the precise radio waveform mapping movement path, or the partial radio waveform mapping movement path of the flying vehicle 202. In actual implementation, the radio waveform mapping refers to the distribution of the radio wave of a specific radio signal source plotted according to a lot of the radio waveform measuring data obtained by measuring radio waveforms at several positions in the space by using a flying vehicle. The distribution is, for example, the distribution of radio characteristics.

Figure 6:
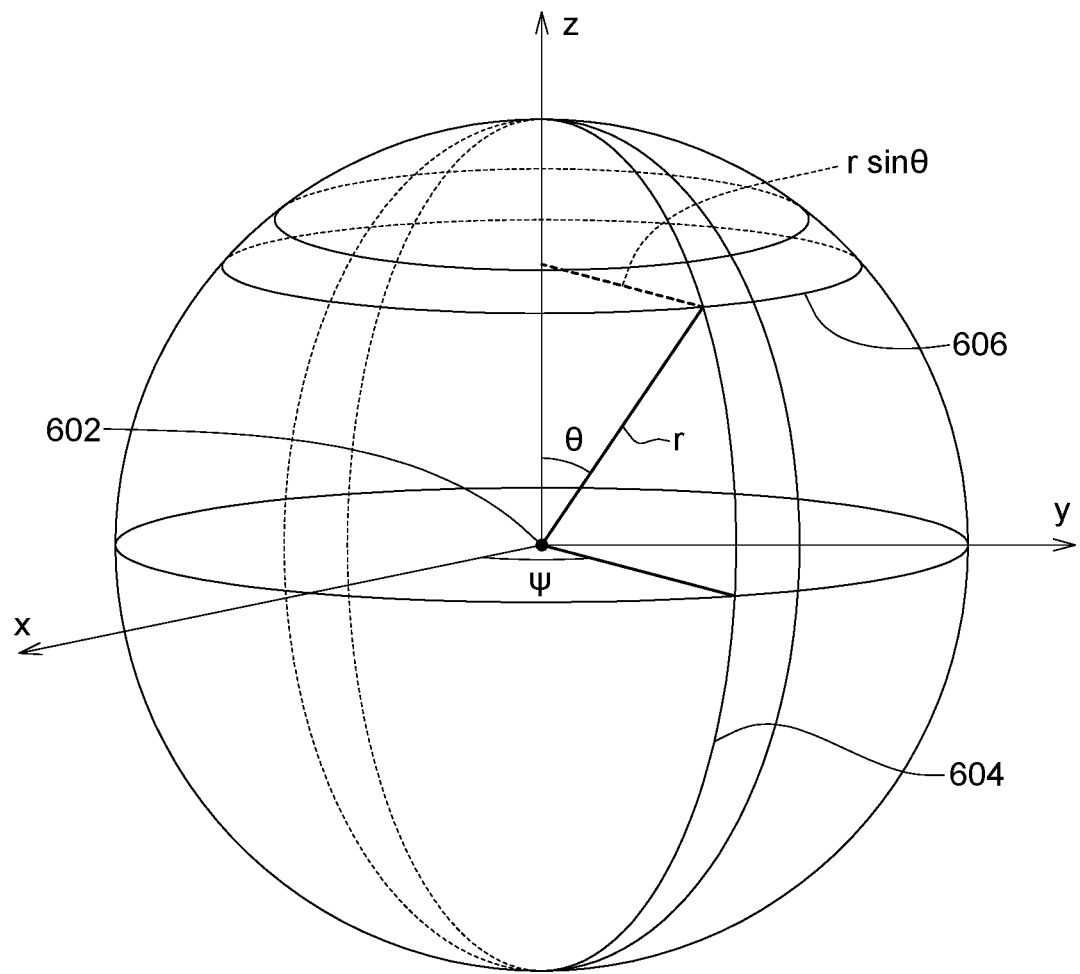
FIG. 6 is an example of comprehensive cross paths in the spherical coordinate system.

The task movement path can be the original movement path of the flying vehicle 202, for example, the default movement path of the formal flight, such as the movement path Pth passing through the flight positions P(1) to P(4) as indicated in FIG. 2. Although the movement path Pth of FIG. 2 is exemplified by the flight positions P(1) to P(4), the movement path Pth may include more flight positions. Through iterative calculation for several positions, estimation error of the base station position can be reduced. The precise radio waveform mapping movement path can be a comprehensive cross path in the 3D coordinate system or a comprehensive cross path in the spherical coordinate system. Referring to FIG. 6, an example of comprehensive cross paths in the spherical coordinate system is shown. The comprehensive cross paths in the spherical coordinate system include several paths 604 formed, for example, by radius γ and several different angles φ (0° to 360°, for example, at a fixed interval of angle) with the reference point 602 being the center of the circle, and several paths 606 formed by radius γ sin θ and several different angles θ (−90° to 90°, for example, at a fixed interval of angle) with the reference point 602 being the center of the circle. The paths 604 and the paths 606 intersect to each other. The partial radio waveform mapping movement path is, for example, one or more than one cross path in the 3D coordinate system or one or more than one cross path in the spherical coordinate system. The partial radio waveform mapping movement path can be some of the paths 604 or some of the paths 606 of FIG. 6.

Then, in step 104, when the position of the radio signal source 204 is estimated according to the first radio signals and the radio channel model, the radio channel model can be dynamically adjusted, and the multiple path effect is reduced. The radio channel model and the parameters of the radio channel model can be dynamically adjusted according to the flight area of the flying vehicle 202. For example, when the coordinates of the satellite positioning system of the flying vehicle 202 (for example, the coordinates obtained using the global positioning system (GPS)) or other drone positioning technology) show that the flight area of the flying vehicle 202 is located at an urban area, the radio channel model applicable to the urban area and the parameters of the radio channel model are selected and used. When the coordinates of the satellite positioning system of the flying vehicle 202 show that the flight area of the flying vehicle 202 is located at a suburb, then the radio channel model applicable to the suburb and the parameter of the radio channel model are selected and used. That is, when the coordinates of the satellite positioning system of the flying vehicle 202 show that the flying vehicle 202 flies to different areas, the wireless channel model can be dynamically adjusted to a suitable wireless channel model. For example, when the flying vehicle 202 flies to different areas, for example, a high altitude, an open space, a suburb, an urban area, or a big city, the wireless channel model can be adaptively and dynamically adjusted to a corresponding wireless channel model. Besides, the radio channel model and the parameters of the radio channel model can also be dynamically adjusted according to the radio frequency of the flying vehicle 202. For example, if the flying vehicle 202 uses a radio frequency of 2.4 GHz, then the radio channel model corresponding to the radio frequency of 2.4 GHz and the parameters of the radio channel model are selected and used. If the flying vehicle 202 uses a radio frequency of 900 MHz, then the radio channel model corresponding to the radio frequency of 900 MHz and the parameters of the radio channel model are selected and used.

The multiple path effect disclosed above can be reduced by way of different methods. For example, a moving average method can be performed to the strengths of the radio signals received by the flying vehicle 202 to reduce the interference of multiple paths. Or, the flying vehicle 202 has several antennas, and average calculation can be performed to the strengths of the radio signals received by the several antennas to obtain the strengths of the radio signals received by the flying vehicle 202 to reduce the interference of multiple paths.

Furthermore, in step 104 of dynamically adjusting the radio channel model in use, the radio channel model in use can be dynamically adjusted manually or automatically. In an embodiment, scenarios of dynamic adjustment include: (1) current state does not match the radio channel model (RCM) applicable condition of the radio channel model in use. For example, the position of the flying vehicle 202 is outside the applicable area of the radio channel model; or the flight altitude of the flying vehicle 202 is over the pre-determined applicable altitude of the radio channel model; (2) the flying vehicle 202 changes the radio frequency, and therefore is not applicable to the current radio channel model; (3) the flying vehicle 202 changes the applicable communication protocol, and therefore is not applicable to the current radio channel model.

During the dynamic adjustment of the radio channel model, if no suitable radio channel model can be found, then the default radio channel model, for example, the free space pass loss model, can be used. When each flying vehicle 202 has more than 2 radio modules 308, each flying vehicle 202 is allowed to use more than one radio channel model (corresponding to different radio modules 308) at the same time.

After the radio channel model is selected, whether the radio channel model needs to be selected again is checked and determined. For, example, if the comparison between the power received by the first radio signals and the signal power estimated according to the radio channel model (the power generated from the attenuation calculated by the radio channel model) is too large, then the radio channel model needs to be checked and selected again, and the adjustment of the radio channel model or the parameters of the radio channel model can be considered. Otherwise, the original radio channel model is used.

Suppose the base station position is unknown in the present step. As indicated in FIG. 2, when trying to find out the base station position through reverse calculation according to the signal strengths measured at a number of flight positions by using the radio channel model but no intersection is found or the intersection area is too large to find out the position of the base station position, then the radio channel model can be replaced.

Suppose the base station position is already known in the present step. For example, the base station position is already confirmed by other information. Meanwhile, if the difference between the signal strength obtained through measurement and that calculated by using the radio channel model is too large, it can be determined that the radio channel model in use may need to be replaced or the parameters of the radio channel model may need to be adjusted. For example, if the current flight environment is sunny but the environmental correction parameter for the rainy environment is used, then the environmental correction parameter can be modified as the environmental correction parameter for the sunny environment.

Possible radio channel models include: free space pass loss model, cost-231-Hata model, Cost-231 Walfisch-Ikegami model, Ericsson 9999 model, Stanford university interim (SUI) model or standard propagation model (SPM).

In step 104 of estimating the position of the radio signal source 204, the coordinates of the position of the radio signal source 204 can be calculated according to the attenuation obtained according to selected radio channel model and the received radio signal strength. Apart from the above method, the signal of the radio signal source 204 can be measured in both a horizontal direction and a vertical direction, and the signal quality data group obtained through measurement is compared with the distribution data of radio waveform of the base station in the database to find out a possible antenna model of the base station. Based on the possible antenna model of the base station obtained through comparison, the radio signal pattern of the radio signal source 204 can be obtained.

After the coordinates of the position of the radio signal source 204 are found, the coordinates still can be iteratively corrected. For example, the flying vehicle 202 can fly to different flight positions and whether the signal attenuation corresponding to the distance between the current flying vehicle 202 and the radio signal source 204 corresponds to the radiation strengths of the first radio signals received by and the current flying vehicle 202 is determined, wherein the signal attenuation is calculated according to the current radio channel model. If the difference is too large, this implies that the calculated coordinates of the position of the radio signal source 204 are not precise enough and still need to be adjusted and corrected.

In step 102 of measuring the first radio signals transmitted by the radio signal source 204 at a number of flight positions during a measurement process, the first radio signals transmitted by the radio signal source 204 can be measured by a number of flying vehicles at several positions. In an embodiment, the flying vehicle performing measurement and the flying vehicle performing tasks can be the same or different.

In an embodiment, when a number of flying vehicles are used for measuring the first radio signals transmitted by the radio signal source 204 at several positions, the radio transception performance of each flying vehicle (for example, antenna gain) is checked and the signals measured by each flying vehicle are normalized. Normalization process can be performed to the antenna gain, such that the first radio signals transmitted by the radio signal source 204 but measured by a number of flying vehicles at several positions can be combined. Thus, a number of flying vehicles can be used to perform measurement at the same time, and the required measuring time can be saved.

In step 106, when a number of first radio characteristics of the first radio signals are obtained and the radio wave distribution of the radio signal source 204 is estimated according to the first radio characteristics of the first radio signals, the first radio characteristics of the first radio signals are normalized, and the normalized first radio characteristics are compared with a waveform characteristic database of the radio signal source 204. If the comparison is successful and a candidate waveform distribution corresponding to the first radio characteristics can be obtained from the comparison with the waveform characteristic database, then the candidate waveform distribution is used. If the comparison not successful, then the radio wave distribution is estimated by using an interpolation method or an averaging method.

Figure 7A:
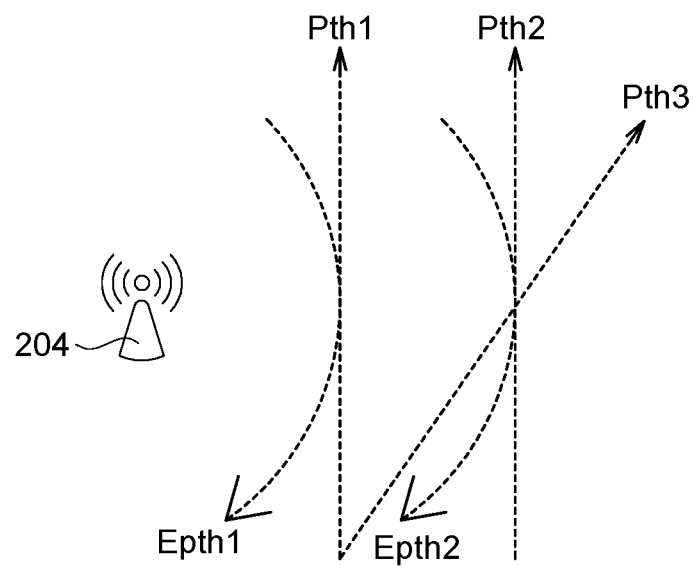
FIG. 7A is a schematic diagram of three paths corresponding to the radio characteristic of the radio signal before the normalization process is performed.
Figure 7B:
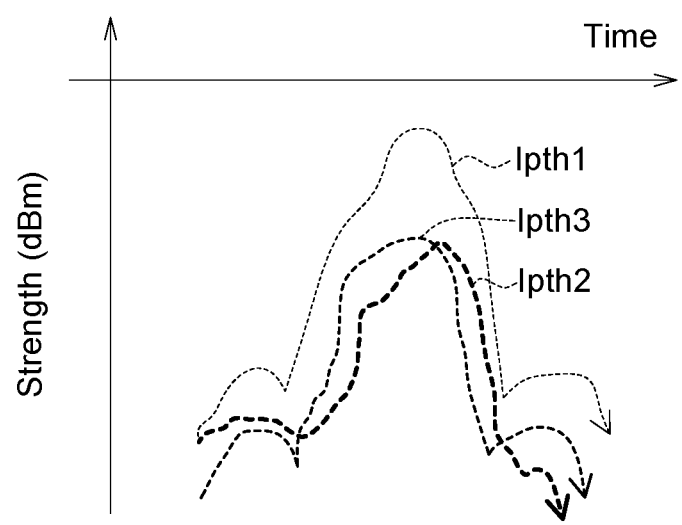
FIG. 7B is an example of the radio characteristic of the radio signal measured on the three paths of FIG. 7A.

Refer to FIG. 7A and FIG. 7B. FIG. 7A is a schematic diagram of three paths corresponding to the first radio characteristics of the first radio signals before the normalization process is performed. FIG. 7B is an example of the first radio characteristics of the first radio signals measured on the three paths of FIG. 7A. Suppose the first radio characteristics of the first radio signals (for example, signal strengths) obtained by the flying vehicle 202 when flying through paths Pth1, Pth2, Pth3 respectively are signal strengths Ipth1, Ipth2, and Ipth3. With the position of the radio signal source, the position of the flying vehicle, the selected radio channel model, and the radio signal strengths received by the flying vehicle 202, the signal strengths Ipth1 to Ipth3 are respectively normalized according to the distance (varied with time) between the flying vehicle on the paths Pth1 to Pth3 and the radio signal source 204. Thus, the radio signal strengths within a specific distance to the radio signal source at each angle can be calculated. Thus, the distribution of the radio signal strengths on the paths Epth1 and Epth2 can be estimated through the paths Pth1 to Pth3.

Through normalization, influencing factors during the measurement process can be eliminated at the same time. For example, the difference in the transception performance of the radio modules of the flying vehicle(s) and the inadequacies in the flight paths of the flying vehicle(s) can be eliminated.

Figure 8A:
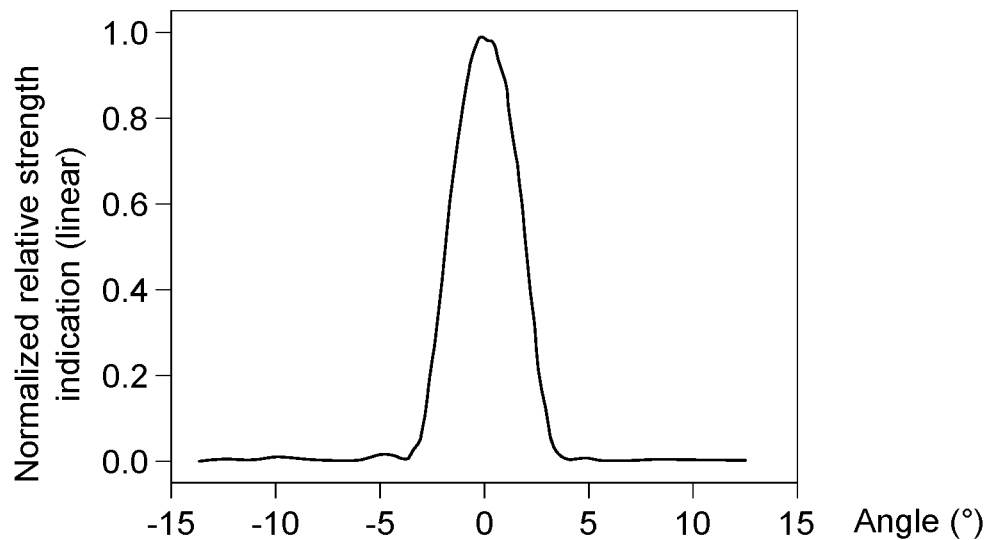
FIG. 8A is a normalized radio strength distribution map obtained from the vertical movement of the flying vehicle.
Figure 8B:
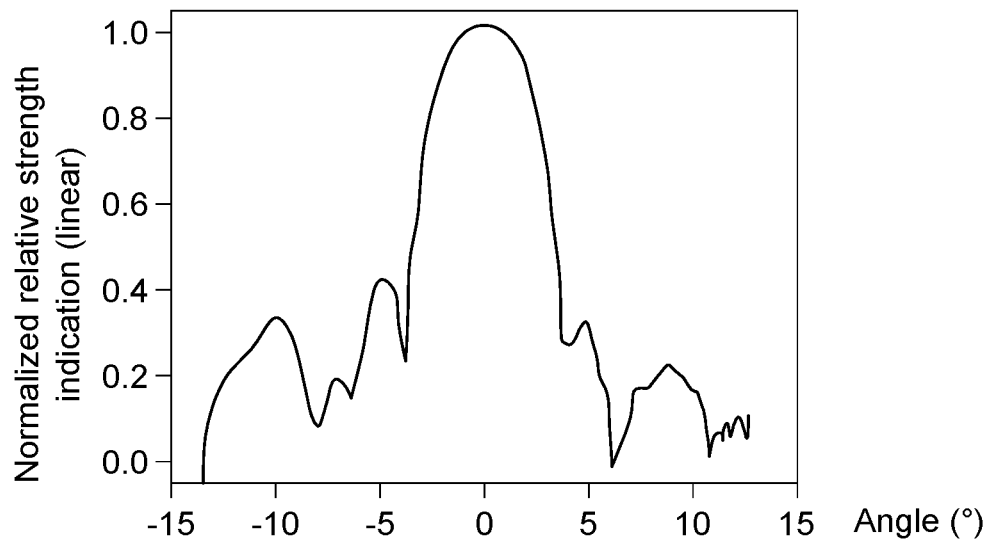
FIG. 8B is a normalized radio strength distribution map obtained from the horizontal movement of the flying vehicle.
Figure 8C:
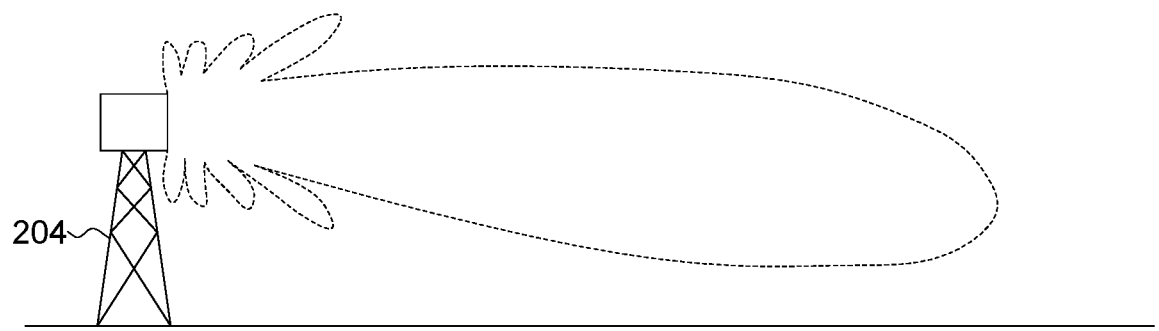
FIG. 8C is an example of a combination of radio wave distribution maps obtained by estimation.

Refer to FIGS. 8A to 8C. FIG. 8A is a normalized radio strength (for example, RSSI) distribution map obtained from the vertical movement of the flying vehicle (right opposite to the antenna). FIG. 8B is a normalized radio strength distribution map obtained from the horizontal movement of the flying vehicle (right opposite to the antenna). FIG. 8C is an example of a combination of radio wave distribution maps obtained by estimation.

FIG. 8A illustrates a distribution of normalized received signal strength indication (RSSI) obtained from the vertical movement of the flying vehicle (for example, an upward vertical movement). The horizontal axis represents angle)(°; the vertical axis represents normalized relative strength indication. The angle 0° represents the plane having the same horizontal altitude with the antenna of the radio signal source 204. The physical meaning of the radio strength distribution map of FIG. 8A is a radio strength distribution of the radio wave radiation of the radio signal source (the base station) at a fan angle. FIG. 8B illustrates a distribution map of normalized radio strength obtained from the horizontal movement of the flying vehicle (for example, the flying vehicle flies on the plane having the same horizontal altitude with the antenna of the radio signal source 204 and moves to perform measurement on a fan track at a fixed distance from the radio signal source). The horizontal axis represents angle)(°; the vertical axis represents normalized strength. The angle 0° represents the position right opposite to the antenna of the radio signal source. The entire radio wave distribution of the radio signal source, for example, the radio waveform of FIG. 8C, can be obtained by combining a lot of different distribution maps of normalized radio strengths (for example, the distribution of FIG. 8A) obtained from vertical movement of the flying vehicle and a lot of distribution maps of normalized radio strengths (for example, the distribution of FIG. 8B) obtained from horizontal movement of the flying vehicle.

Examples of normalized parameters include radio emission power (or power level, for example, level 0, and level 1), transmission gain, small-scale attenuation effect, and so on. The coverage of transmission gain can be obtained with reference to "145-1993-IEEE standard definitions of terms for antennas". The small-scale attenuation effect deals with taking average of several reference signal received powers (RSRP). Thus, the radio strength distribution of FIG. 8C, radio coverage corresponding to emission powers or transmission gains, and the distribution of strengths at each area within the coverage can be calculated.

In step 106, the first radio characteristics of the first radio signals are normalized, and the normalized first radio characteristics are then compared with a waveform characteristic database of the radio signal source 204. For example, the normalized signal strengths Ipth1 to Ipth3 of FIG. 7B are compared with the waveform characteristic database of the radio signal source 204. If the comparison is successful and a candidate waveform distribution corresponding to the first radio characteristics can be found, then the candidate waveform distribution is used as the radio wave distribution of the radio signal source 204. If the comparison is not successful, that is, no candidate waveform distribution corresponding to the first radio characteristics can be found, then the radio wave distribution of the radio signal source is estimated by using an interpolation method or an averaging method according to the normalized signal strengths Ipth1 to Ipth3.

Figure 9:
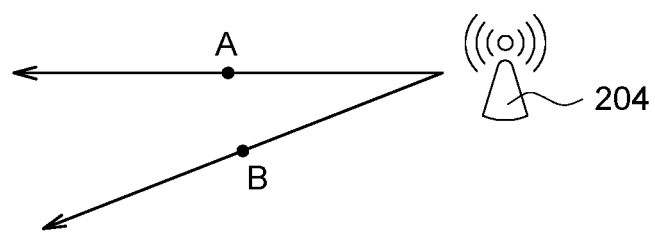
FIG. 9 is a schematic relationship diagram between a radio signal source and two measuring points.

In the above comparison process, comparison can be performed by using, for example, a maximum likelihood algorithm. If no suitable pattern can be found through comparison, then the current radio channel model can be used to estimate the radio radiation strength on the path between the radio signal source (the base station) and the measuring point. Referring to FIG. 9, a schematic relationship diagram between a radio signal source and two measuring points is shown. If the comparison is not successful, then the current radio channel model can be used to estimate the radio radiation strength between the radio signal source 204 and the measuring point A and the radio radiation strength between the radio signal source 204 and the measuring point B. After the radiation strength values of several paths are obtained, the points between the paths can be obtained by using an interpolation method, a weighted averaging method or an averaging method, and can further be used in conjunction with the radio channel model to estimate the radio radiation strength between the paths. For example, the radio radiation strength between the measuring point A and the measuring point B can be obtained by interpolation. Thus, at least the radio radiation strength at the fan area defined by the measuring points A and B and the radio signal source 204 can be obtained, and the radio wave distribution (for example, the radio radiation strengths in the points of the radio wave distribution) of the radio signal source at the fan area defined by the measuring points A and B and the radio signal source 204 can be obtained accordingly.

Figure 10:
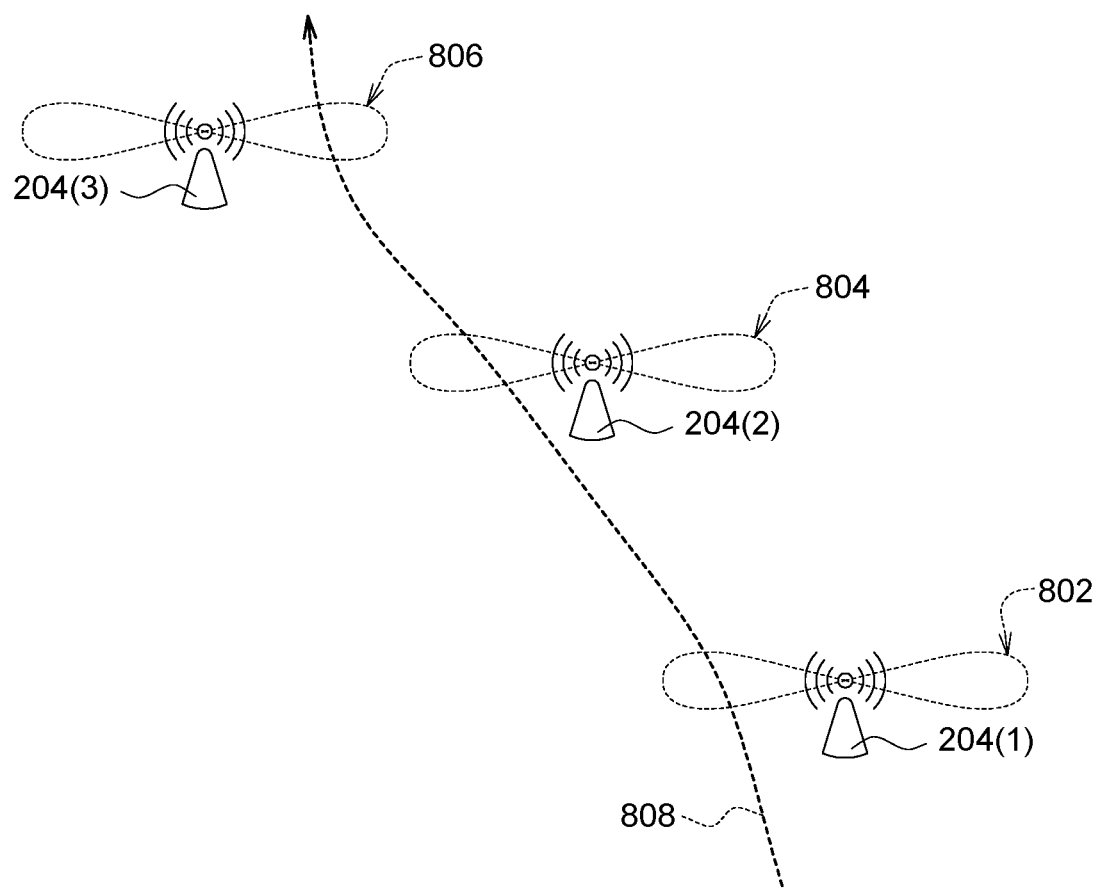
FIG. 10 is a schematic diagram of a number of radio signal sources and their corresponding radio wave distributions, and a planned flight path.

Referring to FIG. 10, a schematic diagram of a number of radio signal sources, radio wave distributions corresponding to the radio signal sources, and a planned flight path are shown. After steps 102 to 106 are performed, the radio wave distribution of the radio signal source 204 can be obtained. If an area has a number of radio signal sources 204, for example, radio signal sources 204(1) to 204(3), then steps 102 to 106 can be repeated to obtain radio wave distributions of the radio signal sources 204(1) to 204(3), for example, radio wave distributions 802, 804, and 806. Thus, when planning a formal flight path 808 of the flying vehicle 202, the formal flight path can be designed to pass through areas with stronger radio radiation strengths, for example, areas of the radio wave distributions 802, 804, and 806. Thus, when the flying vehicle 202 formally flies to perform aerial photography or measurement, unexpected disconnection of wireless communication can be effectively avoided.

Step 108 of FIG. 1B of controlling the flying vehicle to make the antenna radiation pattern of the flying vehicle toward the radio signal source during the flight process may include adjusting the direction of the flying vehicle, the antenna direction of the flying vehicle, or the radio beam forming orientation of the flying vehicle to make the antenna radiation pattern of the flying vehicle toward the radio signal source. The direction of the flying vehicle can be adjusted to make the antenna radiation pattern of the flying vehicle toward the radio signal source; or the antenna direction of the flying vehicle can be adjusted to make the antenna radiation pattern of the flying vehicle toward the radio signal source; or the radio beam forming orientation of the flying vehicle can be adjusted to make the antenna radiation pattern of the flying vehicle toward the radio signal source.

In the process of controlling the flying vehicle to make the antenna radiation pattern of the flying vehicle toward the radio signal source during the flight process, a target radio signal source can be selected beforehand. Firstly, as indicated in FIG. 10, the target radio signal source can be selected from the radio signal sources 204(1) to 204(3). Then, the direction of the target radio signal source is calculated. Then, during the flight process, the antenna radiation pattern of the flying vehicle is continuously adjusted to be toward the selected radio signal source. During the flight process, if the target radio signal source needs to be replaced by a different radio signal source, then the direction of the newly selected target radio signal source is calculated, and the antenna radiation pattern of the flying vehicle is continuously adjusted to be toward the newly selected radio signal source during the flight process.

When determining whether to replace the currently selected radio signal source with a different radio signal source during the flight process or not, the efficiency of the target network (for example, frequency bandwidth) is checked first, and the network efficiency (for example, frequency bandwidth) in the next session of flight time (for example, a few minutes) is checked and estimated. If the network efficiency is found to be unsatisfactory in the next session of flight time, then the current radio signal source can be replaced with a different radio signal source. Or, the radio signal source with fewer turnovers can be selected for wireless network connection.

The present disclosure provides a method and system of measuring radio wave distribution of a radio signal source and estimating corresponding radio characteristics by using a flying vehicle. During a measurement process, the flying vehicle measures a number of first radio signals of a radio signal source (for example, a base station) by using a radio module, and the method and system of the present disclosure are used to obtain the quality of the first radio signals in each area of the space (including the area not actually traveled by the flying vehicle) and further obtain the radio wave distribution in each area of the space. Thus, a most favorable flight path can be designed for the flying vehicle to perform a formal observation task during a flight process, and unexpected disconnection of wireless network communication can be avoided. Besides, the antenna radiation pattern can be adjusted to be toward the radio signal source obtained, such that both the remote-control distance of the flying vehicle and the communication distance of wireless communication between the flying vehicle and the radio signal source can be extended.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method of measuring a radio wave distribution of a radio signal source and estimating corresponding radio characteristics by using a flying vehicle, comprising:
   measuring a plurality of first radio signals transmitted from the radio signal source by the flying vehicle at a plurality of flight positions during a measurement process, wherein the first radio signals are received when the flying vehicle flies through the plurality of flight positions, and the first radio signals carries a radio output power of the radio signal source;
   obtaining signal attenuations from power of the first radio signals received by the flying vehicle with reference to the radio output power of the radio signal source;
   obtaining distances between the flying vehicle at the flight positions and the radio signal source according to the signal attenuations with reference to a radio channel model;
   estimating a position of the radio signal source according to the distances between the flying vehicle at the flight positions and the radio signal source;
   obtaining a plurality of first radio characteristics of the first radio signals based on the received first radio signals, and normalizing the first radio characteristics of the first radio signals, and comparing the normalized first radio characteristics with a waveform characteristic database of the radio signal source;
   estimating the radio wave distribution of the radio signal source according to a result of comparing the normalized first radio characteristics with the waveform characteristic database of the radio signal source; and
   estimating second radio characteristics of a plurality of second radio signals in the radio wave distribution according to the first radio characteristics of the first radio signals, wherein the second radio signals correspond to positions other than the flight positions during the measurement process;

wherein a formal flight path of the flying vehicle is planned according to the position of the radio signal source and strengths of the second radio signals corresponding to the estimated second radio characteristics of the second radio signals, and wherein the first radio characteristics or the second radio characteristics comprise one or more than one of reference signal received power (RSRP), received signal code power (RSCP), received signal level (RX LEVEL), received signal strength indication (RSSI), signal-to-noise ratio (SNR), data transmission rate, signal delay, band stability, and probability of staying connected.

2. The method according to claim 1, wherein the flight positions are a plurality of flight positions of the flying vehicle on a task movement path, a precise radio waveform mapping movement path, or a partial radio waveform mapping movement path.

3. The method according to claim 1, wherein the radio channel model and parameters of the radio channel model are dynamically adjusted according to a flight area or radio frequency of the flying vehicle.

4. The method according to claim 1, wherein the step of measuring the plurality of first radio signals transmitted from the radio signal source by the flying vehicle at the flight positions during the measurement process comprises:

measuring the plurality of first radio signals transmitted from the radio signal source by using a plurality of flying vehicles at the flight positions during the measurement process.

5. The method according to claim 1, wherein the step of estimating the radio wave distribution of the radio signal source according to the result of comparing the normalized first radio characteristics with the waveform characteristic database of the radio signal source further comprises:

after a candidate waveform distribution corresponding to the first radio characteristics are obtained through the comparison with the waveform characteristic database, using the candidate waveform distribution as the radio wave distribution of the radio signal source; and when the comparison with the waveform characteristic database is not successful, estimating the radio wave distribution by using an interpolation method or an averaging method.

6. The method according to claim 1, further comprising:
controlling the flying vehicle to make an antenna radiation pattern of the flying vehicle toward the radio signal source during a flight process.

7. The method according to claim 6, wherein the step of controlling the flying vehicle to make the antenna radiation pattern of the flying vehicle toward the radio signal source during a flight process comprises:

adjusting a direction of the flying vehicle, an antenna direction of the flying vehicle, or a radio beam forming orientation of the flying vehicle to make the antenna radiation pattern of the flying vehicle toward the radio signal source.

8. The system according to claim 1, wherein the estimated radio wave distribution of the radio signal source is a 3D space radio wave distribution.

9. The system according to claim 1, wherein when a first area has a plurality of radio signal sources, a plurality of radio wave distributions corresponding to the plurality of radio signal sources are obtained, wherein the formal flight path of the flying vehicle is planned to pass through a plurality of second areas of the radio wave distributions corresponding to the radio signal sources.

10. A system of measuring a radio wave distribution of a radio signal source and estimating corresponding radio characteristics by using a flying vehicle, comprising:

the flying vehicle, having a radio module configured to receive a plurality of first radio signals transmitted from a radio signal source at a plurality of flight positions during a measurement process, wherein the first radio signals are received when the flying vehicle flies through the plurality of flight positions, and the first radio signals carries a radio output power of the radio signal source;

a flight attitude control module, configured to control a flight path of the flying vehicle, wherein the flight path comprises the flight positions; and a radio characteristic management module, configured to obtain signal attenuations from power of the first radio signals received by the flying vehicle with reference to the radio output power of the radio signal source, obtain distances between the flying vehicle at the flight positions and the radio signal source according to the signal attenuations with reference to a radio channel model, estimate a position of the radio signal source according to the distances between the flying vehicle at the flight positions and the radio signal source, obtain a plurality of first radio characteristics of the first radio signals based on the received first radio signals, normalize the first radio characteristics of the first radio signals, compare the normalized first radio characteristics with a waveform characteristic database of the radio signal source, estimate the radio wave distribution of the radio signal source according to a result of comparing the normalized first radio characteristics with the waveform characteristic database of the radio signal source, and estimate second radio characteristics of a plurality of second radio signals in the radio wave distribution according to the first radio characteristics of the first radio signals, wherein the second radio signals correspond to positions other than the flight positions during the measurement process, wherein a formal flight path of the flying vehicle is planned according to the position of the radio signal source and strengths of the second radio signals corresponding to the estimated second radio characteristics of the second radio signals, and wherein the first radio characteristics or the second radio characteristics comprise one or more than one of RSRP, RSCP, RX LEVEL, RSSI, SNR, data transmission rate, signal delay, band stability, and probability of staying connected.

11. The system according to claim 10, wherein the flight positions are a plurality of flight positions of the flying vehicle on a task movement path, a precise radio waveform mapping movement path, or a partial radio waveform mapping movement path.

12. The system according to claim 10, wherein the radio channel model and parameters of the radio channel model are dynamically adjusted according to a flight area or radio frequency of the flying vehicle.

13. The system according to claim 10, further comprising a plurality of flying vehicles, the flying vehicles measure the first radio signals transmitted from the radio signal source at the flight positions during the measurement process.

14. The system according to claim 10, wherein after a candidate waveform distribution corresponding to the first radio characteristics are obtained through the comparison with the waveform characteristic database, the candidate waveform distribution is used as the radio wave distribution of the radio signal source, and when the comparison with the waveform characteristic database is not successful, the radio wave distribution is estimated by using an interpolation method or an averaging method.

15. The system according to claim 10, wherein the flight attitude control module is further configured to control the flying vehicle to make an antenna radiation pattern of the flying vehicle toward the radio signal source during a flight process.

16. The system according to claim 15, wherein the flight attitude control module makes the antenna radiation pattern of the flying vehicle toward the radio signal source by adjusting a direction of the flying vehicle, an antenna direction of the flying vehicle, or a radio beam forming orientation of the flying vehicle.

17. A method of measuring a radio wave distribution of a radio signal source and estimating corresponding radio characteristics by using a flying vehicle, comprising:

measuring a plurality of first radio signals transmitted from the radio signal source by the flying vehicle at a plurality of flight positions during a measurement process, wherein the flight positions are a plurality of flight positions of a plurality of first paths and a plurality of second paths intersect to each other in a 3D coordinate system or in a spherical coordinate system, and the first radio signals carries a radio output power of the radio signal source;

obtaining signal attenuations from power of the first radio signals received by the flying vehicle with reference to the radio output power of the radio signal source;

obtaining distances between the flying vehicle at the flight positions and the radio signal source according to the signal attenuations with reference to a radio channel model;

estimating a position of the radio signal source according to the distances between the flying vehicle at the flight positions and the radio signal source;

obtaining a plurality of first radio characteristics of the first radio signals based on the received first radio signals, and estimating the radio wave distribution of the radio signal source according to the first radio characteristics of the first radio signals after the position of the radio signal source is estimated, wherein a plurality of first radiation patterns corresponding to the plurality of flight positions of the plurality of first paths and a plurality of second radiation patterns corresponding to the plurality of flight positions of the plurality of second paths are generated and combined to obtain the radio wave distribution of the radio signal source; and estimating a plurality of second radio characteristics of a plurality of second radio signals in the radio wave distribution according to the first radio characteristics of the first radio signals, wherein the second radio signals correspond to positions other than the flight positions during the measurement process, wherein a formal flight path of the flying vehicle is planned according to the position of the radio signal source and strengths of the second radio signals corresponding to the estimated second radio characteristics of the second radio signals, and wherein the first radio characteristics or the second radio characteristics comprise one or more than one of RSRP, RSCP, RX LEVEL, RSSI, SNR, data transmission rate, signal delay, band stability, and probability of staying connected.

18. The system according to claim 17, wherein when a first area has a plurality of radio signal sources, a plurality of radio wave distributions corresponding to the plurality of radio signal sources are obtained;

wherein the formal flight path of the flying vehicle is planned to pass through a plurality of second areas of the radio wave distributions corresponding to the radio signal sources.

* * * * *